US010326088B2

(12) United States Patent
Zan et al.

(10) Patent No.: US 10,326,088 B2
(45) Date of Patent: Jun. 18, 2019

(54) ORGANIC THIN FILM TRANSISTOR AND MANUFACTURING METHOD THEREOF

(71) Applicant: E Ink Holdings Inc., Hsinchu (TW)

(72) Inventors: Hsiao-Wen Zan, Hsinchu (TW); Chuang-Chuang Tsai, Hsinchu (TW); Chun-Chih Chen, Hsinchu (TW); Hung-Chuan Liu, Hsinchu (TW); Zong-Xuan Li, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/939,312

(22) Filed: Mar. 29, 2018

(65) Prior Publication Data
US 2018/0294422 A1  Oct. 11, 2018

(30) Foreign Application Priority Data

Apr. 7, 2017 (CN) .......................... 2017 1 0222765

(51) Int. Cl.
| | | |
|---|---|---|
| *H01L 51/00* | (2006.01) | |
| *H01L 51/05* | (2006.01) | |
| *H01L 51/10* | (2006.01) | |
| *H01L 29/786* | (2006.01) | |
| *H01L 29/417* | (2006.01) | |

(52) U.S. Cl.
CPC .... *H01L 51/0545* (2013.01); *H01L 29/41733* (2013.01); *H01L 29/7869* (2013.01); *H01L 29/78618* (2013.01); *H01L 51/105* (2013.01)

(58) Field of Classification Search
CPC ........... H01L 51/0545; H01L 29/41733; H01L 29/78618; H01L 29/7869; H01L 51/105
See application file for complete search history.

(56) References Cited

U.S. PATENT DOCUMENTS

| | | | |
|---|---|---|---|
| 7,799,597 B2 | 9/2010 | Ahn et al. | |
| 8,207,529 B2 | 6/2012 | Ahn et al. | |
| 8,513,642 B2 | 8/2013 | Afzali-Ardakani et al. | |
| 8,946,068 B2 | 2/2015 | Afzali-Ardakani et al. | |
| (Continued) | | | |

FOREIGN PATENT DOCUMENTS

| | | |
|---|---|---|
| CN | 104037336 A | 9/2014 |
| CN | 106024589 A | 10/2016 |
| TW | 201628089 A | 8/2016 |

OTHER PUBLICATIONS

Corresponding Taiwan office action dated Nov. 28, 2017.

*Primary Examiner* — Victor A Mandala
*Assistant Examiner* — Colleen E Snow
(74) *Attorney, Agent, or Firm* — CKC & Partners Co., LLC

(57) ABSTRACT

An organic thin film transistor includes a substrate, a hydrophobic layer, an oxide layer, a hydrophilic layer, a semiconductor layer, and a source/drain layer. The hydrophobic layer covers a surface of the substrate. The oxide layer is located on the hydrophobic layer and has plural segments. The hydrophilic layer is located on the segments of the oxide layer, and the oxide layer is located between the hydrophilic layer and the hydrophobic layer. The semiconductor layer is located on the hydrophilic layer, and the hydrophilic layer is located between the semiconductor layer and the oxide layer. The source/drain layer connects across the semiconductor layer on the segments of the oxide layer.

17 Claims, 8 Drawing Sheets

(56) References Cited

U.S. PATENT DOCUMENTS

| | | |
|---|---|---|
| 2007/0090362 A1* | 4/2007 | Ahn ................. B82Y 10/00 257/66 |
| 2008/0268582 A1 | 10/2008 | Arai et al. |
| 2010/0029049 A1* | 2/2010 | Do ................. H01L 51/0533 438/158 |
| 2011/0244639 A1 | 10/2011 | Ogawa et al. |
| 2015/0333110 A1* | 11/2015 | Park ................. H01L 21/308 257/40 |
| 2016/0043315 A1 | 2/2016 | Mandal et al. |
| 2016/0291365 A1* | 10/2016 | Kwon ................. G02F 1/1341 |

* cited by examiner

ORGANIC THIN FILM TRANSISTOR AND MANUFACTURING METHOD THEREOF

RELATED APPLICATIONS

This application claims priority to China Application Serial Number 201710222765.3, Apr. 7, 2017, which is herein incorporated by reference.

BACKGROUND

Field of Invention

The present invention relates to an organic thin film transistor and a manufacturing method of the organic thin film transistor.

Description of Related Art

In the present technology, an organic thin film transistor may be manufactured by a solution process. For example, a substrate is coated by a specific solution. After the solution is solidified, the solidified solution is patterned by processes of coating photoresist, exposure, development, and etching.

The solidified solution may be hydrophilic or hydrophobic. When a hydrophilic material and a hydrophobic material are patterned in a typical solution process, since photolithography processes including exposure and development are performed, a hydrophilic film is in contact with photoresist. As a result, the hydrophilic film may be damaged by the photoresist during the patterning process, thereby affecting an arrangement of a hydrophilic self-assembly monolayer (SAM).

SUMMARY

An aspect of the present invention is to provide an organic thin film transistor.

According to an embodiment of the present invention, an organic thin film transistor includes a substrate, a hydrophobic layer, an oxide layer, a hydrophilic layer, a semiconductor layer, and a source/drain layer. The hydrophobic layer covers a surface of the substrate. The oxide layer is located on the hydrophobic layer and has plural segments. The hydrophilic layer is located on the segments of the oxide layer, and the oxide layer is located between the hydrophilic layer and the hydrophobic layer. The semiconductor layer is located on the hydrophilic layer, and the hydrophilic layer is located between the semiconductor layer and the oxide layer. The source/drain layer connects across the semiconductor layer on the segments of the oxide layer.

In one embodiment of the present invention, longitudinal directions of the segments of the oxide layer are substantially parallel to each other.

In one embodiment of the present invention, a longitudinal direction of the source/drain layer is substantially perpendicular to a longitudinal direction of the semiconductor layer.

In one embodiment of the present invention, a trench is between two adjacent segments of the oxide layer, and the hydrophobic layer is exposed through the trench.

In one embodiment of the present invention, the hydrophobic layer is made of a material including polymethyltriethoxysilane.

In one embodiment of the present invention, the oxide layer is made of a material including silicon oxide.

In one embodiment of the present invention, the hydrophilic layer is made of a material including thiophenol.

In one embodiment of the present invention, the source/drain layer is made of a material including aluminum.

In one embodiment of the present invention, the substrate is made of a material including silicon or silicon oxide.

An aspect of the present invention is to provide a manufacturing method of an organic thin film transistor.

According to an embodiment of the present invention, a manufacturing method of an organic thin film transistor includes forming a hydrophobic layer to cover a surface of a substrate; forming a patterned oxide layer on the hydrophobic layer, such that the oxide layer has plural segments; immersing the substrate on which the oxide layer and the hydrophobic layer are located in a hydrophilic solution; taking out the substrate on which the oxide layer and the hydrophobic layer are located from the hydrophilic solution, thereby forming a hydrophilic layer on the segments of the oxide layer; forming a semiconductor layer on the hydrophilic layer; and forming a source/drain layer to connect across the semiconductor layer.

In one embodiment of the present invention, forming the patterned oxide layer on the hydrophobic layer includes forming a photoresist layer on the hydrophobic layer; patterning the photoresist layer to form plural openings therein, in which the hydrophobic layer is exposed through the openings; forming the oxide layer on the photoresist layer and the hydrophobic layer that is in the openings; and removing the photoresist layer and the oxide layer that is on the photoresist layer.

In one embodiment of the present invention, a bonding force between the hydrophobic layer and the oxide layer is greater than a bonding force between the hydrophobic layer and the photoresist layer.

In one embodiment of the present invention, the hydrophobic layer covers the surface of the substrate by coating.

In one embodiment of the present invention, the oxide layer is formed on the hydrophobic layer by vapor deposition.

In one embodiment of the present invention, a bonding force between the hydrophilic solution and the oxide layer is greater than a bonding force between the hydrophilic solution and the hydrophobic layer.

In one embodiment of the present invention, the semiconductor layer is formed on the hydrophilic layer by coating.

In one embodiment of the present invention, the source/drain layer is formed on the semiconductor layer by electroplating.

In the aforementioned embodiment of the present invention, through the manufacturing method of the organic thin film transistor, the substrate having the patterned oxide layer is immersed in the hydrophilic solution, and thus the hydrophilic solution is attached to the segments of the oxide layer. As a result, the patterned hydrophilic layer can be formed on the segments of the oxide layer. Therefore, the hydrophilic layer of the organic thin film transistor can be patterned without needing steps of coating photoresist, exposure, development, and etching, thereby preventing the hydrophilic layer from being in contact with the photoresist and being damaged. In a subsequent process, an arrangement of the hydrophilic semiconductor layer will not be affected by patterning the hydrophilic layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
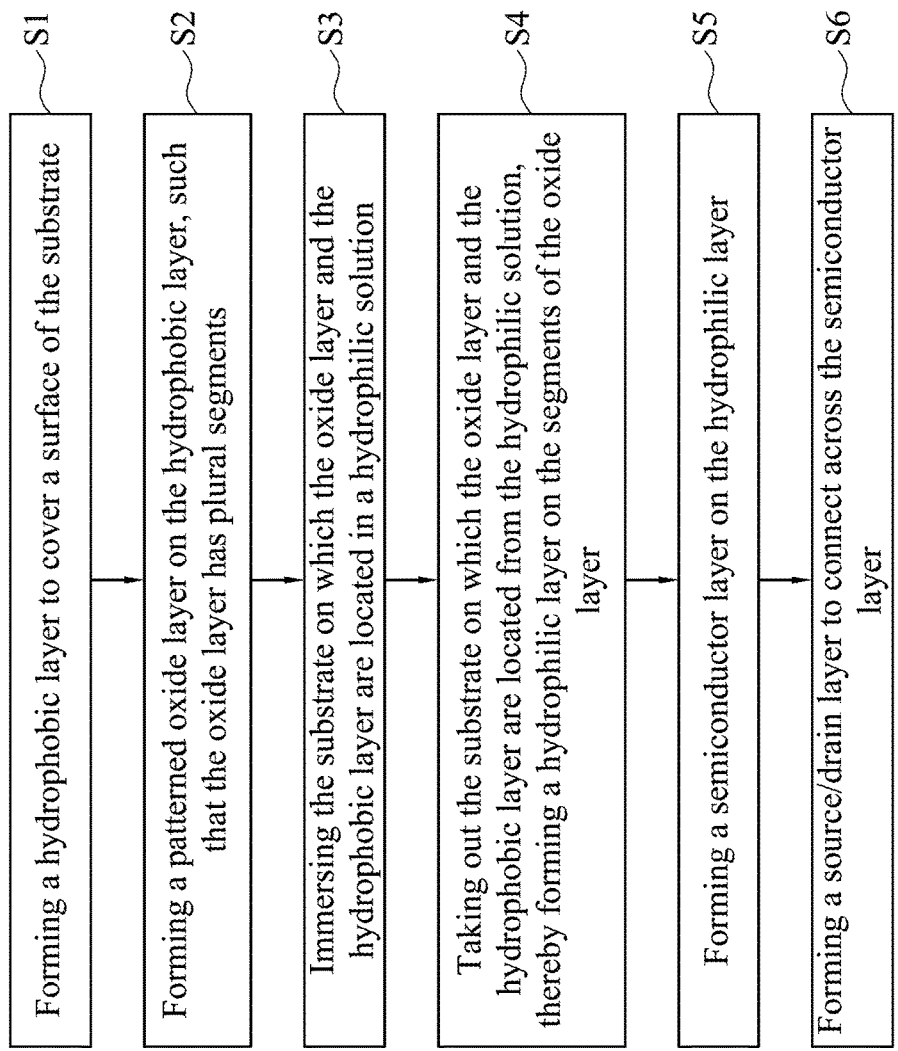
FIG. 1 is a flow chart of a manufacturing method of an organic thin film transistor according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a flow chart of a manufacturing method of an organic thin film transistor according to one embodiment of the present invention. The manufacturing method of the organic thin film transistor includes the following steps. In step S1, a hydrophobic layer is formed to cover a surface of a substrate. Thereafter, in step S2, a patterned oxide layer is formed on the hydrophobic layer, such that the oxide layer has plural segments. Next, in step S3, the substrate on which the oxide layer and the hydrophobic layer are located is immersed in a hydrophilic solution. Afterwards, in step S4, the substrate on which the oxide layer and the hydrophobic layer are located is taken out from the hydrophilic solution, thereby forming a hydrophilic layer on the segments of the oxide layer. Thereafter, in step S5, a semiconductor layer is formed on the hydrophilic layer. Subsequently, in step S6, a source/drain layer is formed to connect across the semiconductor layer.

The aforementioned steps will be described hereinafter.

Figure 2:
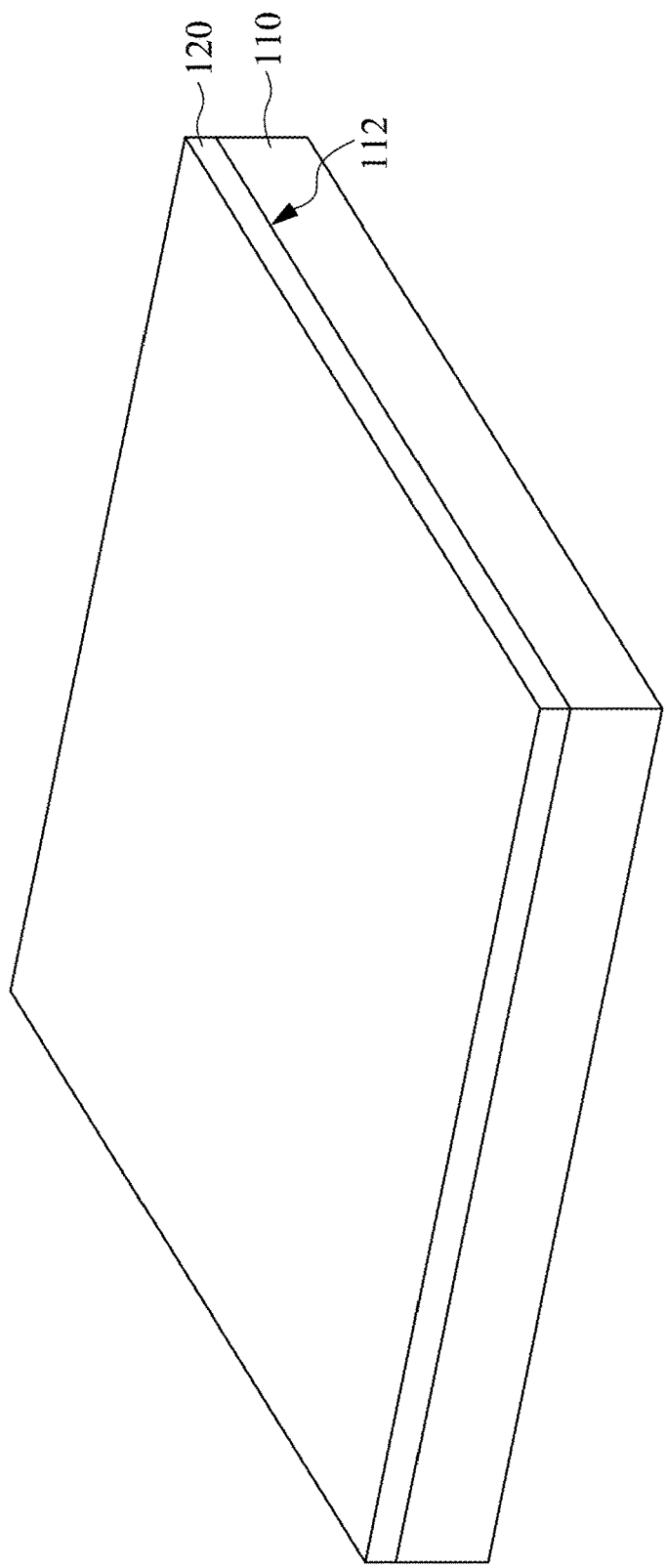
FIGS. 2 to 8 are perspective views of intermediate steps of manufacturing an organic thin film transistor according to one embodiment of the present invention.

FIGS. 2 to 8 are perspective views of intermediate steps of manufacturing an organic thin film transistor according to one embodiment of the present invention. As shown in FIG. 2, a hydrophobic layer 120 may be formed to on a surface 112 of a substrate 110, and thus the hydrophobic layer 120 covers the surface 112 of the substrate 110. The hydrophobic layer 120 may cover the surface 112 of the substrate 110 by coating. For example, the substrate 110 is coated by a hydrophobic solution, and then the hydrophobic solution is solidified to form the hydrophobic layer 120. In this embodiment, the substrate 110 may be made of a material including silicon or silicon oxide, and the hydrophobic layer 120 may be made of a material including polymethyltriethoxysilane (PTS), but the present invention is not limited in this regard.

Figure 3:
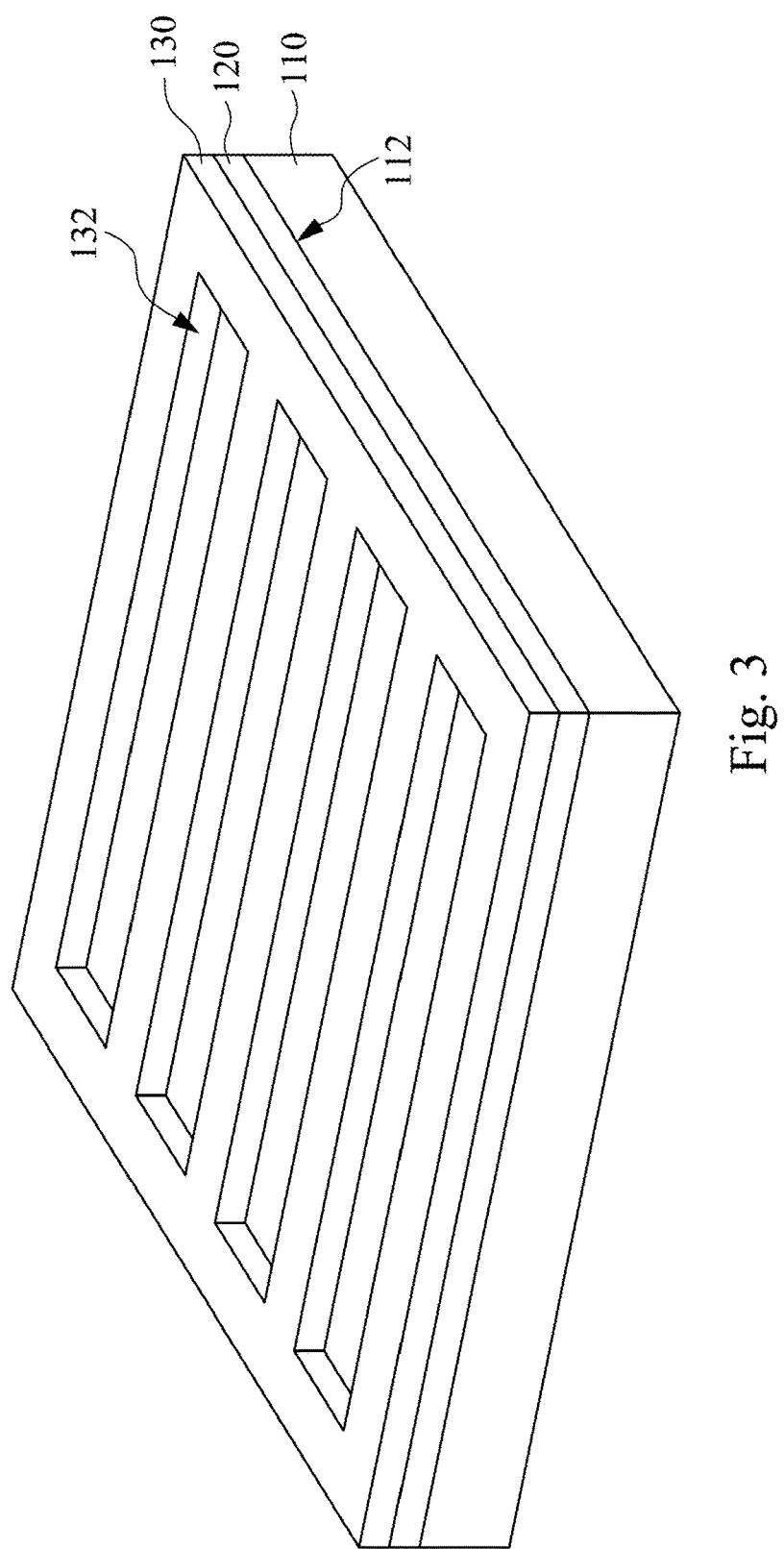

As shown in FIG. 2 and FIG. 3, after the hydrophobic layer 120 is formed on the substrate 110, a photoresist layer 130 may be formed on the hydrophobic layer 120. Thereafter, the photoresist layer 130 is patterned, and thus the photoresist layer 130 has plural openings 132 therein, and the hydrophobic layer 120 is exposed through the openings 132 of the photoresist layer 130. For example, the openings 132 may be formed in the photoresist layer 130 by an exposure process and a development process.

Figure 4:
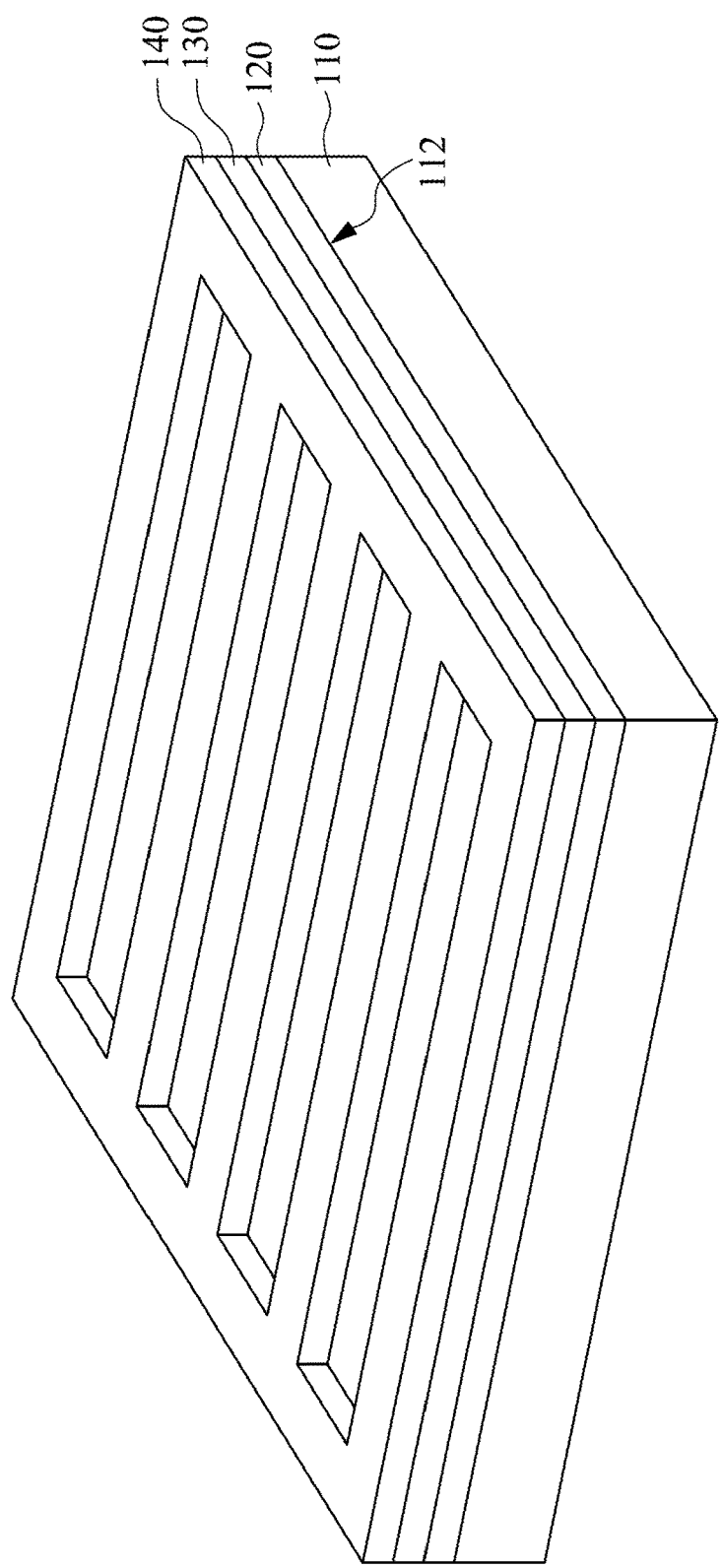

As shown in FIG. 3 and FIG. 4, thereafter, an oxide layer 140 may be formed on the photoresist layer 130 and the hydrophobic layer 120 that is in the openings 132 of the photoresist layer 130. In this embodiment, the oxide layer 140 may be made of a material including silicon oxide (SiOx), and the oxide layer 140 may be formed on the photoresist layer 130 and the hydrophobic layer 120 that is in the openings 132 by vapor deposition. Through the step, the photoresist layer 130 is covered by the oxide layer 140, as illustrated in FIG. 4.

Figure 5:
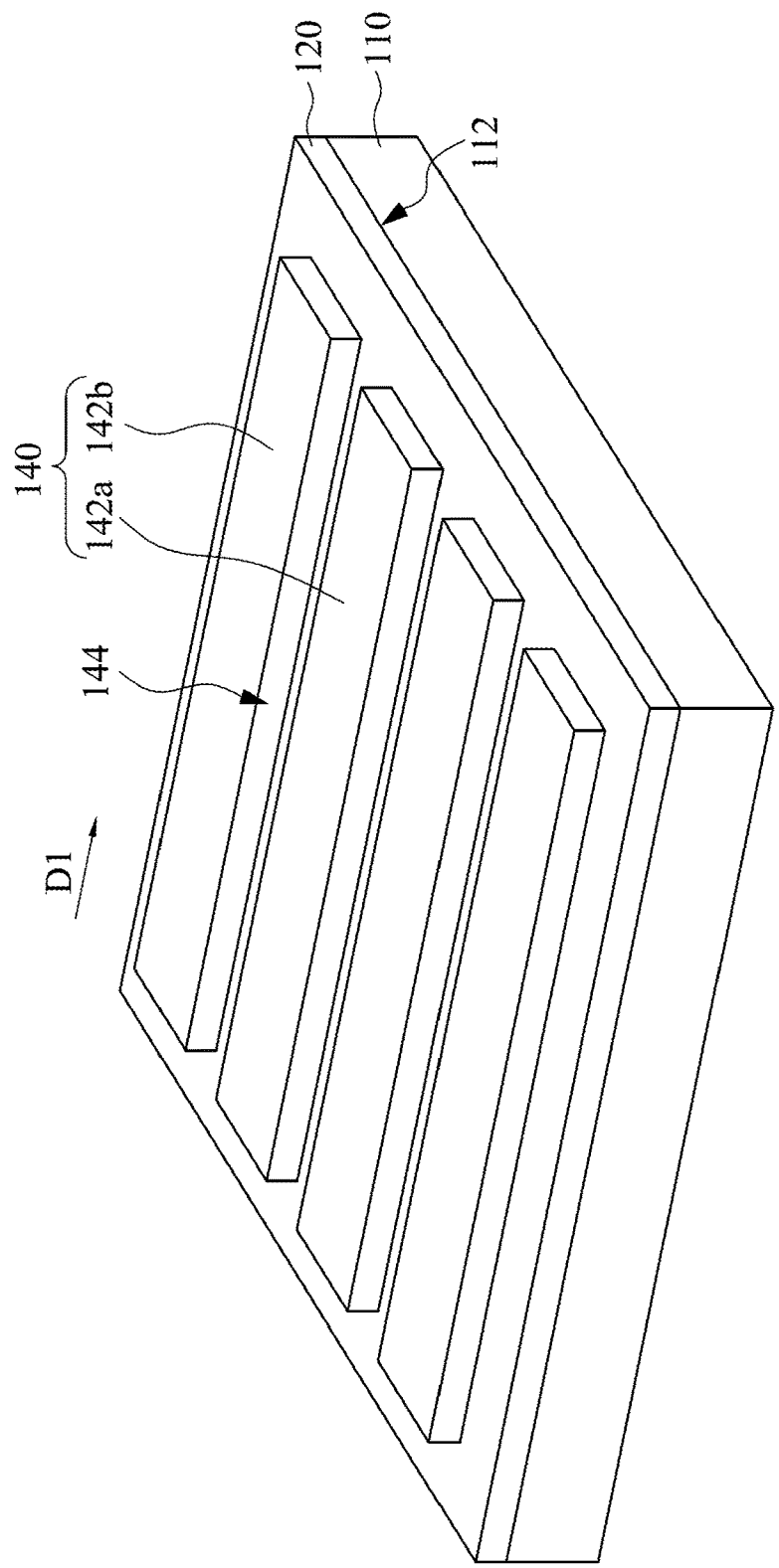

As shown in FIG. 4 and FIG. 5, after the oxide layer 140 is formed on the photoresist layer 130 and the hydrophobic layer 120 that is in the openings 132, the photoresist layer 130 and the oxide layer 140 on the photoresist layer 130 may be removed. Since the oxide layer 140 is hydrophobic, a bonding force between the hydrophobic layer 120 and the oxide layer 140 is greater than a bonding force between the hydrophobic layer 120 and the photoresist layer 130. As a result, after the photoresist layer 130 is removed (i.e., PR strip), the oxide layer 140 in the openings 132 of the photoresist layer 130 can be caught by the hydrophobic layer 120 in the openings 132, and does not separate from the hydrophobic layer 120 with the photoresist layer 130. However, the photoresist layer 130 and the oxide layer 140 overlapping the photoresist layer 130 are lifted off together. In other words, a top surface of the structure shown in FIG. 3 has different surface affinities for the oxide layer 140.

Through aforementioned steps, the patterned oxide layer 140 is formed on the hydrophobic layer 120, as illustrated in FIG. 5. The oxide layer 140 of FIG. 5 has plural segments, and the positions and number of the segments respectively correspond to that of the openings 132 of the photoresist layer 130, and the positions and number of the segments and the positions and number of the openings 132 can be determined as deemed necessary by designers. In order to simplify the following description, segments 142a and 142b are used as an example.

In this embodiment, longitudinal directions D1 of the segments 142a and 142b of the oxide layer 140 are substantially parallel to each other. A trench 144 is between the two adjacent segments 142a and 142b of the oxide layer 140, and the hydrophobic layer 120 is exposed through the trench 144.

Figure 6:
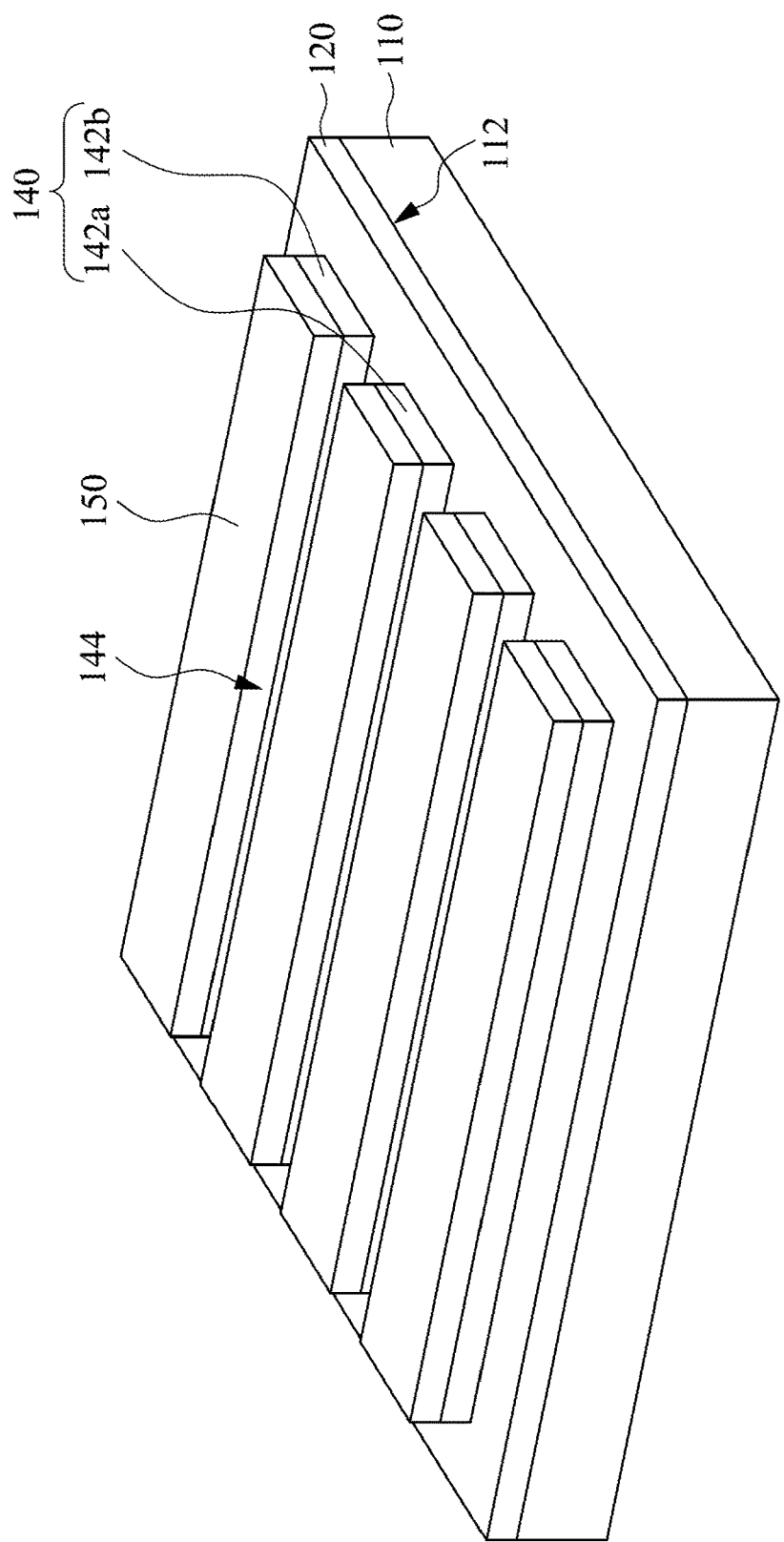

As shown in FIG. 5 and FIG. 6, after the patterned oxide layer 140 is formed, the substrate 110 having the oxide layer 140 and the hydrophobic layer 120 (i.e., the structure of FIG. 5) is immersed in a hydrophilic solution. Thereafter, the substrate 110 on which the oxide layer 140 and the hydrophobic layer 120 are located is taken out from the hydrophilic solution. The hydrophilic solution is bonded to the oxide layer 140, but is not bonded to the hydrophobic layer 120. Therefore, the hydrophilic solution is attached to the oxide layer 140, and is not attached to the hydrophobic layer 120. In other words, a top surface of the structure shown in FIG. 5 has different surface affinities for the hydrophilic solution. After the hydrophilic solution attached to the oxide layer 140 is solidified, a hydrophilic layer 150 is formed on the segments 142a and 142b of the oxide layer 140.

The patterned hydrophilic layer 150 (i.e., the hydrophilic layer 150 on the oxide layer 140) can be formed by the aforementioned steps without needing steps of coating photoresist, exposure, development, and etching, thereby preventing the hydrophilic layer 150 from being in contact with photoresist and being damaged during the patterning step. In a subsequent process, an arrangement of a self-assembly monolayer (SAM) is not affected by patterning the hydrophilic layer 150.

In this embodiment, the hydrophilic solution and the hydrophilic layer 150 that is cured from the hydrophilic solution may be made of a material including thiophenol, but the present invention is not limited in this regard. Moreover, since the hydrophilic solution is boned to the oxide layer 140 and is not boned to the hydrophobic layer 120, a bonding force between the hydrophilic solution and the oxide layer 140 is greater than a bonding force between the hydrophilic solution and the hydrophobic layer 120.

Figure 7:
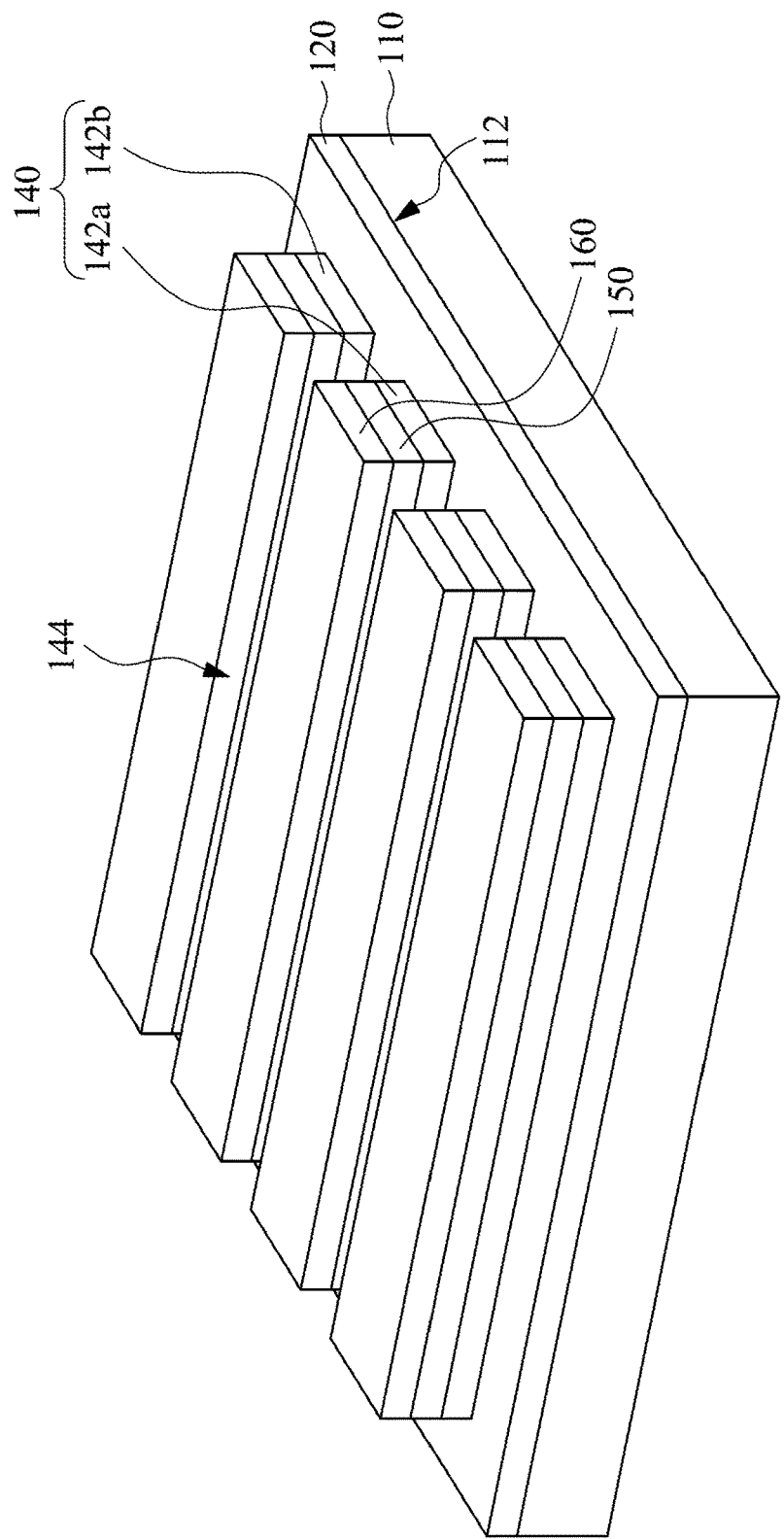

As shown in FIG. 6 and FIG. 7, thereafter, a semiconductor layer 160 may be formed on the hydrophilic layer 150. The semiconductor layer 160 is a self-assembly monolayer, and may be made of an organic material, such as tips-pentacene, and can act as an active layer. In this embodiment, the semiconductor layer 160 may be formed on the hydrophilic layer 150 by coating. For example, a blade may be utilized to coat the semiconductor layer 160 on the hydrophilic layer 150 and the hydrophobic layer 120. Since the semiconductor layer 160 is hydrophilic, the semiconductor layer 160 is attached to the hydrophilic layer 150 but is not attached to the hydrophobic layer 120. In other words, a top surface of the structure shown in FIG. 6 has different surface affinities for the semiconductor layer 160, and different regions of the top surface have difference hydrophilicity and hydrophobicity. Through the aforementioned step, the patterned semiconductor layer 160 may be obtained, and the oxide layer 140 can be self-aligned with the semiconductor layer 160 over the oxide layer 140.

Figure 8:
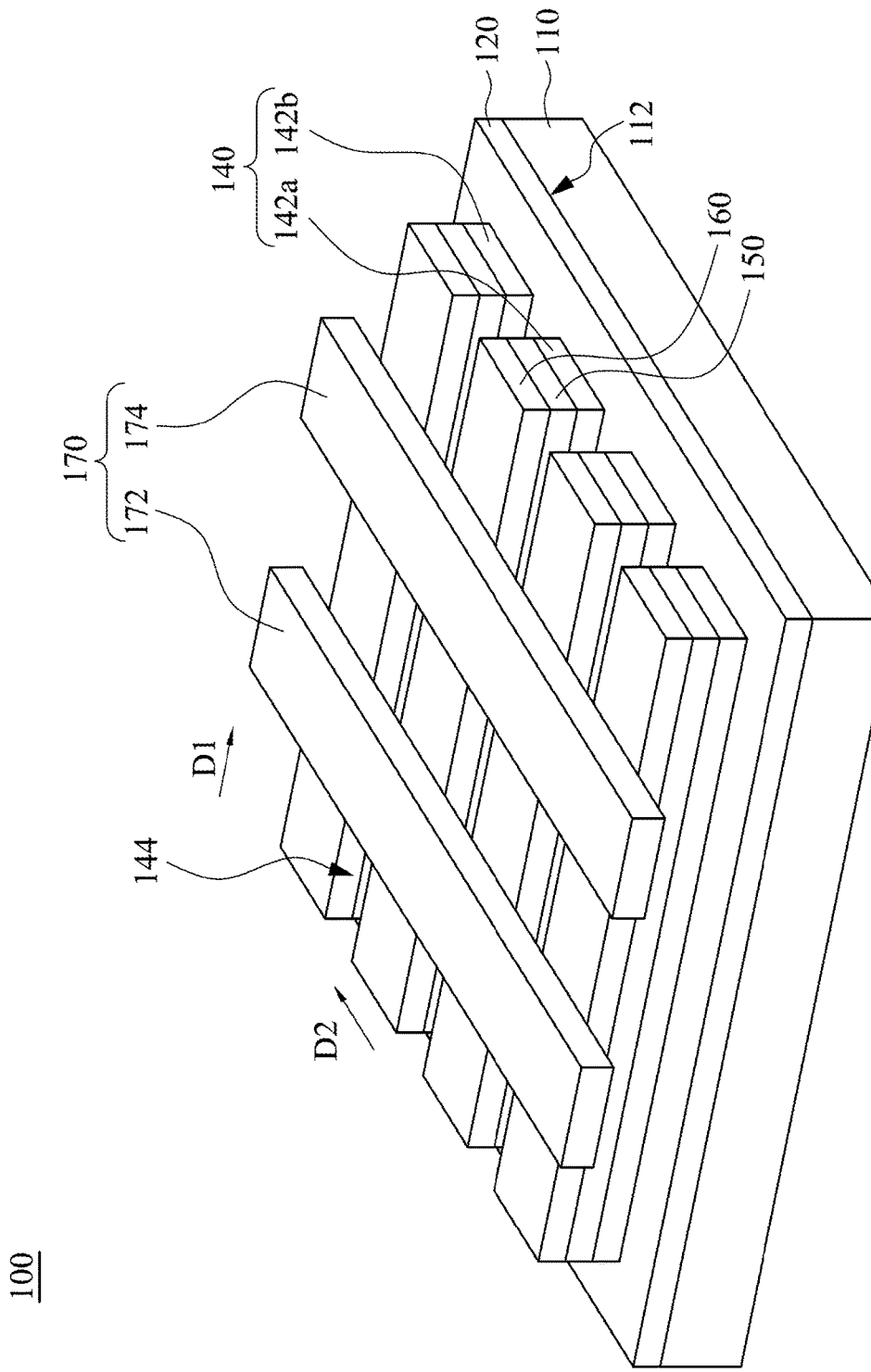

As shown in FIG. 7 and FIG. 8, after the patterned semiconductor layer 160 is formed, a source/drain layer 170 is formed to connect across the semiconductor layer 160. That is, the source/drain layer 170 is disposed on the semiconductor layer 160, and extends across two adjacent segments of the semiconductor layer 160 that are at two sides of the trench 144. For example, a longitudinal direction D2 of the source/drain layer 170 is substantially perpendicular to the longitudinal direction D1 of the semiconductor layer 160.

The source/drain layer 170 includes a source electrode 172 and a drain electrode 174. In this embodiment, the source/drain layer 170 is made of a material including aluminum, and is formed on the semiconductor layer 160 by electroplating, but the present invention is not limited in this regard. In addition, the substrate 110 may act as a gate electrode through a doping process.

Through the aforementioned manufacturing method of the organic thin film transistor, an organic thin film transistor 100 of FIG. 8 may be formed. As shown in FIG. 8, the organic thin film transistor 100 includes the substrate 110, the hydrophobic layer 120, the oxide layer 140, the hydrophilic layer 150, the semiconductor layer 160, and the source/drain layer 170. The hydrophobic layer 120 covers the surface 112 of the substrate 110. The oxide layer 140 is located on the hydrophobic layer 120 and has segments 142a and 142b. The hydrophilic layer 150 is located on the segments 142a and 142b of the oxide layer 140, and the oxide layer 140 is located between the hydrophilic layer 150 and the hydrophobic layer 120. The semiconductor layer 160 is located on the hydrophilic layer 150, and the hydrophilic layer 150 is located between the semiconductor layer 160 and the oxide layer 140. The source/drain layer 170 connects across the semiconductor layer 160 on the segments 142a and 142b of the oxide layer 140.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. An organic thin film transistor, comprising:
   a substrate;
   a hydrophobic layer covering a surface of the substrate;
   an oxide layer located on the hydrophobic layer and having plural segments;
   a hydrophilic layer located on the segments of the oxide layer, wherein the oxide layer is located between the hydrophilic layer and the hydrophobic layer;
   a semiconductor layer located on the hydrophilic layer, wherein the hydrophilic layer is located between the semiconductor layer and the oxide layer; and
   a source/drain layer connecting across the semiconductor layer on the segments of the oxide layer.

2. The organic thin film transistor of claim 1, wherein longitudinal directions of the segments of the oxide layer are substantially parallel to each other.

3. The organic thin film transistor of claim 1, wherein a longitudinal direction of the source/drain layer is substantially perpendicular to a longitudinal direction of the semiconductor layer.

4. The organic thin film transistor of claim 1, wherein a trench is between two adjacent segments of the oxide layer, and the hydrophobic layer is exposed through the trench.

5. The organic thin film transistor of claim 1, wherein the hydrophobic layer is made of a material comprising polymethyltriethoxysilane.

6. The organic thin film transistor of claim 1, wherein the oxide layer is made of a material comprising silicon oxide.

7. The organic thin film transistor of claim 1, wherein the hydrophilic layer is made of a material comprising thiophenol.

8. The organic thin film transistor of claim 1, wherein the source/drain layer is made of a material comprising aluminum.

9. The organic thin film transistor of claim 1, wherein the substrate is made of a material comprising silicon or silicon oxide.

10. A manufacturing method of an organic thin film transistor, the manufacturing method comprising:
    forming a hydrophobic layer to cover a surface of a substrate;
    forming a patterned oxide layer on the hydrophobic layer, wherein the oxide layer has plural segments;
    immersing the substrate on which the oxide layer and the hydrophobic layer are located in a hydrophilic solution;
    taking out the substrate on which the oxide layer and the hydrophobic layer are located from the hydrophilic solution, thereby forming a hydrophilic layer on the segments of the oxide layer;
    forming a semiconductor layer on the hydrophilic layer; and
    forming a source/drain layer to connect across the semiconductor layer.

11. The manufacturing method of claim 10, wherein forming the patterned oxide layer on the hydrophobic layer comprises:
    forming a photoresist layer on the hydrophobic layer;
    patterning the photoresist layer to form plural openings therein, wherein the hydrophobic layer is exposed through the openings;
    forming the oxide layer on the photoresist layer and the hydrophobic layer that is in the openings; and removing the photoresist layer and the oxide layer that is on the photoresist layer.

12. The manufacturing method of claim 11, wherein a bonding force between the hydrophobic layer and the oxide layer is greater than a bonding force between the hydrophobic layer and the photoresist layer.

13. The manufacturing method of claim 10, wherein the hydrophobic layer covers the surface of the substrate by coating.

14. The manufacturing method of claim 10, wherein the oxide layer is formed on the hydrophobic layer by vapor deposition.

15. The manufacturing method of claim 10, wherein a bonding force between the hydrophilic solution and the oxide layer is greater than a bonding force between the hydrophilic solution and the hydrophobic layer.

16. The manufacturing method of claim 10, wherein the semiconductor layer is formed on the hydrophilic layer by coating.

17. The manufacturing method of claim 10, wherein the source/drain layer is formed on the semiconductor layer by electroplating.

* * * * *